(12) United States Patent
Park et al.

(10) Patent No.: US 9,159,628 B2
(45) Date of Patent: Oct. 13, 2015

(54) COMBINATION-TYPE TRANSISTOR AND METHOD FOR MANUFACTURING SAME

(75) Inventors: Jong Hoon Park, Incheon (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 33 days.

(21) Appl. No.: 14/361,708

(22) PCT Filed: May 15, 2012

(86) PCT No.: PCT/KR2012/003814
§ 371 (c)(1),
(2), (4) Date: May 30, 2014

(87) PCT Pub. No.: WO2013/081259
PCT Pub. Date: Jun. 6, 2013

(65) Prior Publication Data
US 2014/0327083 A1 Nov. 6, 2014

(30) Foreign Application Priority Data

Nov. 30, 2011 (KR) .......... 10-2011-0126571

(51) Int. Cl.
*H01L 21/8238* (2006.01)
*H01L 27/06* (2006.01)
*H01L 27/07* (2006.01)
*H01L 21/8228* (2006.01)

(52) U.S. Cl.
CPC ........ *H01L 21/8238* (2013.01); *H01L 21/8228* (2013.01); *H01L 27/0623* (2013.01); *H01L 27/0705* (2013.01)

(58) Field of Classification Search
CPC ........... H01L 2224/73265; H01L 2224/48227; H01L 2924/00; H01L 2224/32145; H01L 2924/00012; H01L 2224/32225; H01L 2224/92247; H01L 2224/48247; H01L 2924/00014; H01L 2924/0002; H01L 2924/30107
USPC ........... 327/158, 175, 77, 153, 161, 109, 141, 327/170, 355, 538, 565, 108, 149, 151, 152, 327/155, 156, 163, 171, 178, 199, 236, 243, 327/321, 325, 333, 361, 391, 530, 536, 539, 327/540, 564; 336/200, 232; 365/194, 365/189.05, 191, 222, 189.02, 226, 230.03, 365/233.1, 189.11
See application file for complete search history.

(56) References Cited

U.S. PATENT DOCUMENTS

| | | | |
|---|---|---|---|
| 6,670,678 B2 | 12/2003 | Kojima | |
| 2008/0079035 A1 | 4/2008 | Bobde | |
| 2010/0207161 A1 | 8/2010 | Shrivastava et al. | |

FOREIGN PATENT DOCUMENTS

| | | |
|---|---|---|
| JP | 2003-258200 A | 9/2003 |
| KR | 10-1998-0086423 A1 | 12/1998 |
| KR | 10-0884981 B1 | 2/2009 |

*Primary Examiner* — Robert Bachner
(74) *Attorney, Agent, or Firm* — Revolution IP, PLLC

(57) ABSTRACT

Disclosed is a combination-type transistor including a first MOSFET that includes a gate, a first source formed on one side of the gate, and a first drain formed on the other side of the gate; a second MOSFET that includes the gate, a second drain formed on the one side of the gate, and a second source formed on the other side of the gate; a first BJT that is formed such that the first source of the first MOSFET is used as an emitter, the second drain of the second MOSFET is used as a collector, and the substrate is used as a base; and a second BJT that is formed such that the second source of the second MOSFET is used as an emitter, the first drain of the first MOSFET is used as a collector, and the substrate is used as a base.

16 Claims, 4 Drawing Sheets

US 9,159,628 B2

COMBINATION-TYPE TRANSISTOR AND METHOD FOR MANUFACTURING SAME

CROSS REFERENCE TO PRIOR APPLICATIONS

This application is a National Stage Application of PCT International Patent Application No. PCT/KR2012/003814 filed on May 15, 2012, under 35 U.S.C. §371, which claims priority to Korean Patent Application No. 10-2011-0126571 filed on Nov. 30, 2011, which are all hereby incorporated by reference in their entirety.

TECHNICAL FIELD

The present invention relates to a technology of combining two kinds of transistors, and more particularly, a transistor obtained by combining a MOSFET (Metal Oxide Semiconductor Field Effect Transistor) and a BJT (Bipolar Junction Transistor), and a method for manufacturing the same.

BACKGROUND ART

A transistor is an essential device that are used in all electronic circuits. There are various kinds of transistors, and the transistors are categorized by BJTs (Bipolar Junction Transistor) and FETs (Field Effect Transistor).

The BJT is a bipolar device and a current control device, and the FET is a unipolar device and a voltage control device. Among the FETs, a transistor that is frequently used in recent years is a MOSFET (Metal Oxide Semiconductor Field Effect Transistor).

FIG. 1 schematically illustrates an example of a configuration of a MOSFET transistor according to the related art. As illustrated in FIG. 1, a MOSFET 100 includes a gate 101, a source 102, and a drain 103 that are formed on a semiconductor substrate 105. When a voltage is applied to the gate 101, a channel 104 is formed between the drain 103 and the source 102 to allow electric charges to move. For example, when the substrate 105 is a P-type semiconductor and the source 102 and the drain 103 are doped as N-type semiconductors, a N-channel is formed.

FIG. 2 schematically illustrates an example of a configuration of a BJT transistor according to the related art. As illustrated in FIG. 2, a BJT 200 includes a base 201, an emitter 202, and a collector 203 that are formed on a substrate 205. In the BJT 200, currents flow due to differences in electron concentrations between the base 201, the emitter 202 and the collector 203. For example, when the emitter 202 and the collector 203 are doped as N-type semiconductors and the base 201 is doped as a P-type semiconductor, an N-type BJT is formed.

The two kinds of transistors have merits and demerits. The MOSFET has the merits in that power consumption is low and it is easy to integrate, whereas the BJT has the merit in that an operation speed is fast. In order to use all the merits of the MOSFET and the BJT, it may be considered that the two transistors are combined. However, since the MOSFET and the BJT are manufactured by different processes from each other, it is difficult to combine the two transistors. Accordingly, in general, one kind of transistor appropriate for a circuit to be used is selected and used.

A technology which is a background of the present invention is described in Korean Patent Publication No. 1998-086423 (Dec. 5, 1998) which is Patent Literature 1. Patent Literature 1 discloses a technology of a combination-type transistor in which the MOSFET and the BJT are combined. Patent Literature 1 discloses a combined MOS/bipolar transistor used in a BiCMOS circuit. However, the transistor of Patent Literature 1 has demerits in that a manufacturing process is complicated and it is high cost. Accordingly, there is a need for development of a combination-type transistor of the MOSFET and the BJT that can be simply manufactured with ease.

DISCLOSURE

Technical Problem

In order to solve the problems, an object of the present invention is to provide a transistor in which a MOSFET and a BJT are easily combined, and a method for manufacturing the same.

Technical Solution

An exemplary embodiment of the present invention provides a combination-type transistor including a first MOSFET that is formed on a substrate, and includes a gate, a first source formed on one side of the gate, and a first drain formed on the other side of the gate; a second MOSFET that includes the gate, a second drain formed on the one side of the gate so as to face the first source, and a second source formed on the other side of the gate so as to face the first drain; a first BJT that is formed such that the first source of the first MOSFET is used as an emitter, the second drain of the second MOSFET is used as a collector, and the substrate is used as a base; and a second BJT that is formed such that the second source of the second MOSFET is used as an emitter, the first drain of the first MOSFET is used as a collector, and the substrate is used as a base.

Further, the gate and the base may be connected using a metal layer.

Furthermore, the first source and the first drain of the first MOSFET and the second source and the second drain of the second MOSFET may be N-type semiconductors, and the substrate may be a P-type semiconductor.

Moreover, the first source and the first drain of the first MOSFET and the second source and the second drain of the second MOSFET may be P-type semiconductors, and the substrate may be an N-type semiconductor.

In addition, a capacitor may be connected between the gate and the base.

Another exemplary embodiment of the present invention provides a method for manufacturing a combination-type transistor including forming a first MOSFET that is formed on a substrate and includes a gate, a first source formed on one side of the gate, and a first drain formed on the other side of the gate; forming a second MOSFET that includes a second drain formed on the one side of the gate so as to face the first source, and a second source formed on the other side of the gate so as to face the first drain; forming a first BJT such that the first source of the first MOSFET is used as an emitter, the second drain of the second MOSFET is used as a collector, and the substrate is used as a base; and forming a second BJT such that the second source of the second MOSFET is used as an emitter, the first drain of the first MOSFET is used as a collector, and the substrate is used as a base.

Advantageous Effects

According to a combination-type transistor and a method for manufacturing a combination-type transistor according to the present invention, since MOSFETs and BJTs are combined to be simultaneously used, it is possible to use all merits of the two transistors.

Furthermore, since the BJTs are formed within the MOSFETs, it is possible to simply manufacture the combination-type transistor with ease.

Moreover, since the MOSFETs are arranged such that currents flow in the two MOSFETs facing each other in an opposite direction to each other, it is possible to decrease a parasitic inductance generated in a channel of the MOSFET by a mutual inductance generated between the MOSFETs. Accordingly, it is possible to reduce power loss due to the parasitic inductance in a super high frequency region.

BEST MODE

Hereinafter, embodiments of the present invention will be described in detail with reference to the accompanying drawings. The terminologies used herein are selected in consideration of functions in the embodiments, and meanings of the teminologies may be different depending on a user, an intenstion of an operator and a judical precedent. Therefore, it should be understood that the terminologies used in the following embodiments are used as meanings that are specifically defined in the present specification, but may be used as meanings which can be in common understood by those having ordinary skill in the art if the terminologies are not specifically defined.

Figure 1:
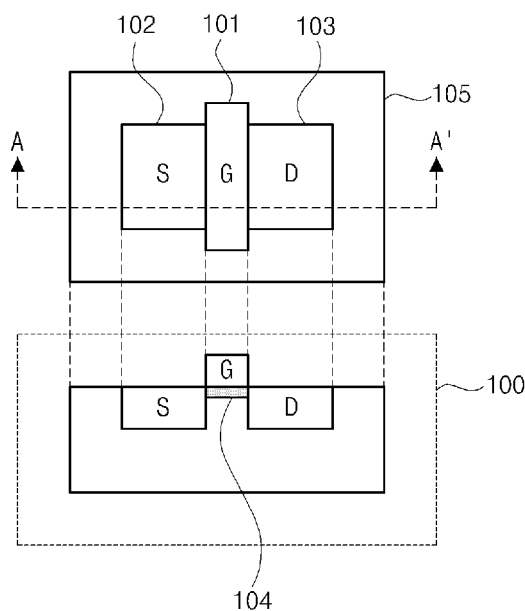
FIG. 1 schematically illustrates a configuration of a MOSFET according to the related art.
Figure 2:
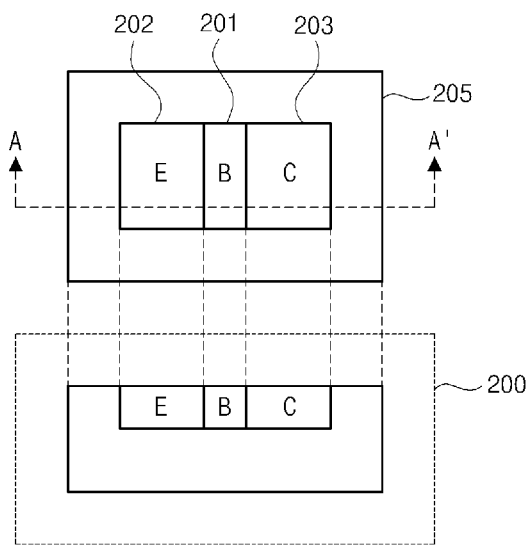
FIG. 2 schematically illustrates a configuration of a BJT according to the related art.
Figure 3:
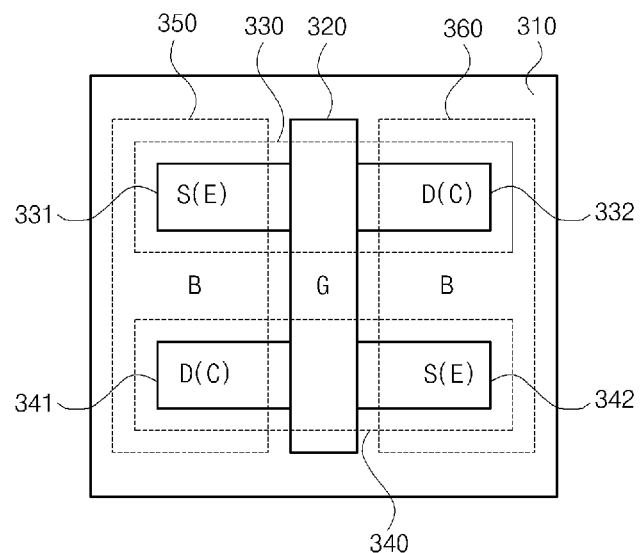
FIG. 3 schematically illustrates a configuration of a combination-type transistor according to an embodiment of the present invention.

FIG. 3 illustrates an example of a configuration of a combination-type transistor according to an embodiment of the present invention.

As illustrated in FIG. 3, a first MOSFET 330 in which a first source 331 formed on one side and a first drain 332 formed on the other side are disposed with a gate 320 interposed therebetween is formed on a semiconductor substrate 310. Further, a second MOSFET 340 in which a second drain 341 facing the first source 331 and a second source 342 facing the first drain 332 are formed with the gate 320 interposed therebetween is formed below the first MOSFET 330 on the substrate 310.

Meanwhile, when the first source 331 of the first MOSFET 330 is used as an emitter, the second drain 341 of the second MOSFET 340 is used as a collector and the substrate 310 is used as a base, a first BJT 350 can be formed. Furthermore, when the second source 342 of the second MOSFET 340 is used as an emitter, the first drain 332 of the first MOSFET 320 is used as a collector and the substrate 310 is used as a base, a second BJT 360 can be formed.

For example, when the MOSFETs 330 and 340 are N-channels, since the drains and sources 331, 332, 341 and 342 are N-type semiconductors and the substrate 310 disposed between them is a P-type semiconductor, the BJTs 350 and 360 can be formed within the MOSFETs 330 and 340.

Figure 4:
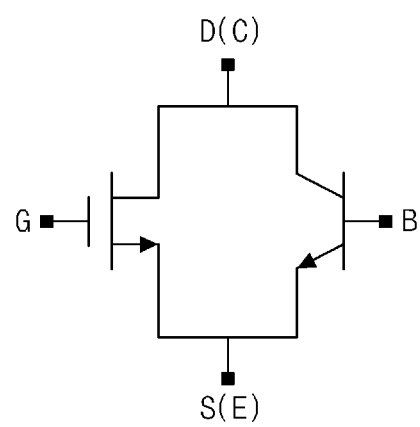
FIG. 4 is a circuit diagram of the combination-type transistor of FIG. 3.

FIG. 4 is a circuit diagram of the combination-type transistor. As illustrated in FIG. 4, the combination-type transistor of the MOSFET and the BJT according to the present invention shares the drain D and the collector C, and shares the source S and the emitter E.

Figure 5:
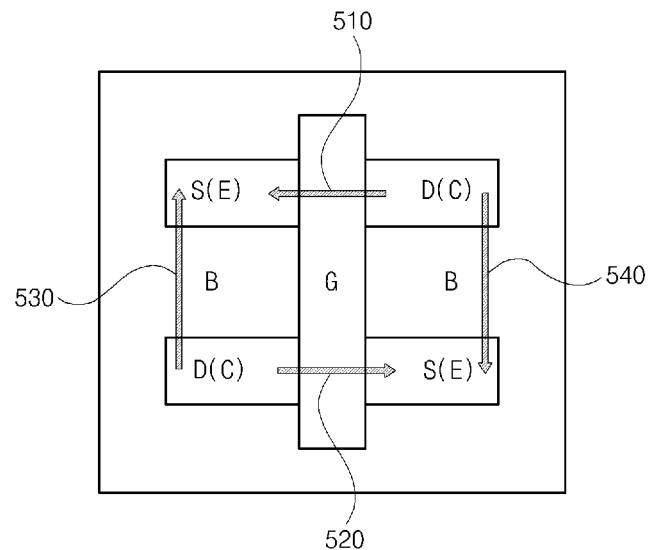
FIG. 5 illustrates a direction in which currents flow when the combination-type transistor of FIG. 3 operates.

A direction in which currents flow when the combination-type transistor according to the embodiment of the present invention operates is illustrated in FIG. 5. As illustrated in FIG. 5, it can be seen that a current direction 510 in the first MOSFET 330 and a current direction 520 in the second MOSFET 340 are opposite to each other and a current direction 530 in the first BJT 350 and a current direction 540 in the second BJT 360 are opposite to each other. That is, currents flow in the MOSFETs facing each other in an opposite direction, and currents flow in the BJTs facing each other in an opposite direction.

In general, a channel inductance component other than a channel resistance component exists in a channel of the MOSFET. Further, a source resistance component and a source inductance component exist in a source region, and a drain resistance component and a drain inductance component exist in a drain region. Such an inductance is a parasitic inductance, and as an operation frequency of the transistor is high, impedance is increased to cause power loss.

In the embodiment of the present invention, as described above, since the current directions of the first MOSFET 330 and the second MOSFET 340 are opposite to each other, mutual inductances are generated between the drain and the source facing each other and between the channels. In this case, since the currents of the first MOSFET 330 and the second MOSFET 340 flow in the opposite direction, a source inductance generated in the first source 331 and a drain inductance generated in the second drain 341 may be offset or decreased by the mutual inductance. Moreover, a drain inductance generated in the first drain 332 and a source inductance generated in the second source 342 may be offset or decreased by the mutual inductance. In addition, a channel inductance of the first MOSFET 330 and a channel inductance of the second MOSFET 340 may also be offset or decreased by the mutual inductance.

In this way, in the embodiment of the present invention, since the MOSFETs are arranged such that the currents flow in the two MOSFETs in the opposite direction, it is possible to decrease the parasitic inductance generated in the channel of the MOSFET by the mutual inductances generated between them.

The combination-type transistor according to the embodiment of the present invention can be manufactured by a known general transistor manufacturing process. For example, the combination-type transistor can be manufactured using, for example, a semiconductor wafer through an oxide film forming process, a photolithography process, a deposition process, a diffusion or ion implant process and a metal deposition process.

Next, another embodiment of the present invention which is a modification of the embodiment of the present invention illustrated in FIGS. 3 and 4 will be described with reference to FIGS. 6 and 7.

Figure 6:
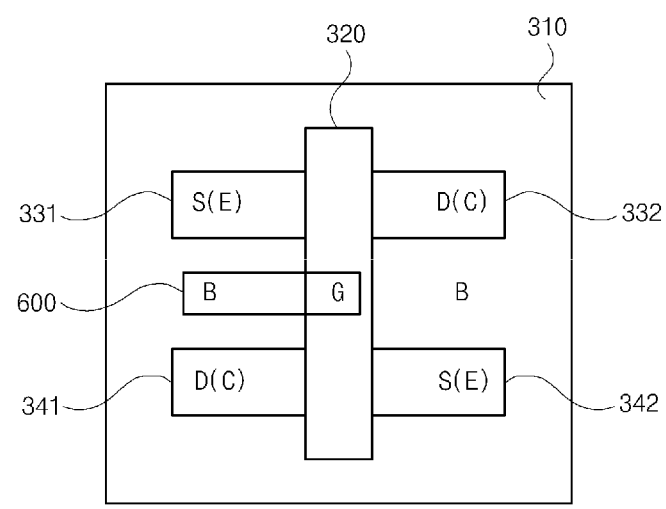
FIG. 6 schematically illustrates a configuration of a combination-type transistor according to another embodiment of the present invention.

In the embodiment illustrated in FIG. 6, a gate G and a base B are connected using a metal layer 600. A circuit diagram of the combination-type transistor of FIG. 6 is illustrated in FIG. 7.

Figure 7:
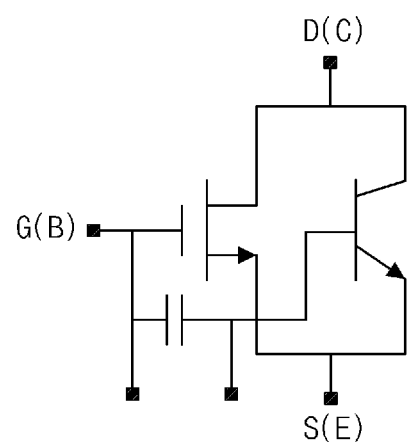
FIG. 7 is a circuit diagram of the combination-type transistor of FIG. 6.

As illustrated in FIGS. 6 and 7, a drain D and a collector C are shared, a source S and an emitter E are shared, and a gate G and a base B are also shared. In this way, when the gate G and the base B are connected, it is possible to control the gate G and the base B as one.

Further, a capacitor may be connected between the gate G and the base B. Since the capacitor blocks a DC component, it is possible to respectively supply different biases to the gate G and the base B.

As described above, in accordance with the combination-type transistor structure of the MOSFET and the BJT according to the embodiment of the present invention, since the MOSFET and the BJT can be simultaneously used, it is possible to use all of the merits of the two transistors.

The present invention has been described in connection with the preferred embodiments with reference to the accompanying drawings, but is not limited thereto. Therefore, the present invention should be interpreted by the claims intended as including modifications that can be derived from the embodiments.

The invention claimed is:

1. A combination-type transistor comprising:
   a first MOSFET that is formed on a substrate, and includes a gate, a first source formed on one side of the gate, and a first drain formed on the other side of the gate;
   a second MOSFET that includes the gate, a second drain formed on the one side of the gate so as to face the first source, and a second source formed on the other side of the gate so as to face the first drain;
   a first BJT that is formed such that the first source of the first MOSFET is used as an emitter, the second drain of the second MOSFET is used as a collector, and the substrate is used as a base; and
   a second BJT that is formed such that the second source of the second MOSFET is used as an emitter, the first drain of the first MOSFET is used as a collector, and the substrate is used as a base.

2. The combination-type transistor of claim 1, wherein the gate and the base are connected using a metal layer.

3. The combination-type transistor of claim 1, wherein the first source and the first drain of the first MOSFET and the second source and the second drain of the second MOSFET are N-type semiconductors, and the substrate is a P-type semiconductor.

4. The combination-type transistor of claim 1, wherein the first source and the first drain of the first MOSFET and the second source and the second drain of the second MOSFET are P-type semiconductors, and the substrate is an N-type semiconductor.

5. The combination-type transistor of claim 1, wherein a capacitor is connected between the gate and the base.

6. The combination-type transistor of claim 2, wherein the first source and the first drain of the first MOSFET and the second source and the second drain of the second MOSFET are N-type semiconductors, and the substrate is a P-type semiconductor.

7. The combination-type transistor of claim 2, wherein the first source and the first drain of the first MOSFET and the second source and the second drain of the second MOSFET are P-type semiconductors, and the substrate is an N-type semiconductor.

8. The combination-type transistor of claim 2, wherein a capacitor is connected between the gate and the base.

9. A method for manufacturing a combination-type transistor, comprising:
   forming a first MOSFET that is formed on a substrate and includes a gate, a first source formed on one side of the gate, and a first drain formed on the other side of the gate;
   forming a second MOSFET that includes a second drain formed on the one side of the gate so as to face the first source, and a second source formed on the other side of the gate so as to face the first drain;
   forming a first BJT such that the first source of the first MOSFET is used as an emitter, the second drain of the second MOSFET is used as a collector, and the substrate is used as a base; and
   forming a second BJT such that the second source of the second MOSFET is used as an emitter, the first drain of the first MOSFET is used as a collector, and the substrate is used as a base.

10. The method for manufacturing a combination-type transistor of claim 9, wherein the gate and the base are connected using a metal layer.

11. The method for manufacturing a combination-type transistor of claim 9, wherein the first source and the first drain of the first MOSFET and the second source and the second drain of the second MOSFET are N-type semiconductors, and the substrate is a P-type semiconductor.

12. The method for manufacturing a combination-type transistor of claim 9, wherein the first source and the first drain of the first MOSFET and the second source and the second drain of the second MOSFET are P-type semiconductors, and the substrate is an N-type semiconductor.

13. The method for manufacturing a combination-type transistor of claim 9, wherein a capacitor is connected between the gate and the base.

14. The method for manufacturing a combination-type transistor of claim 10, wherein the first source and the first drain of the first MOSFET and the second source and the second drain of the second MOSFET are N-type semiconductors, and the substrate is a P-type semiconductor.

15. The method for manufacturing a combination-type transistor of claim 10, wherein the first source and the first drain of the first MOSFET and the second source and the second drain of the second MOSFET are P-type semiconductors, and the substrate is an N-type semiconductor.

16. The method for manufacturing a combination-type transistor of claim 10, wherein a capacitor is connected between the gate and the base.

* * * * *